United States Patent [19]
De Keyzer et al.

[11] Patent Number: 5,691,105
[45] Date of Patent: Nov. 25, 1997

[54] METHOD FOR MAKING AN IMAGING ELEMENT AND A PRINTING PLATE ACCORDING TO THE SILVER SALT DIFFUSION TRANSFER PROCESS

[75] Inventors: René De Keyzer, Waasmunster; Yves Van Meenen, Berchem, both of Belgium

[73] Assignee: AGFA-Gevaert, N.V., Mortsel, Belgium

[21] Appl. No.: 745,843

[22] Filed: Nov. 12, 1996

Related U.S. Application Data

[60] Provisional application No. 60/009,382, Dec. 29, 1995.

[30]  Foreign Application Priority Data

Nov. 20, 1995 [EP] European Pat. Off. ............ 95203170.6

[51] Int. Cl.$^6$ ................................. G03C 8/28; G03F 7/07
[52] U.S. Cl. ......................... 430/204; 430/231; 430/247
[58] Field of Search ...................................... 430/231, 247, 430/204

[56] References Cited

U.S. PATENT DOCUMENTS

| | | | |
|---|---|---|---|
| 4,281,056 | 7/1981 | Berke | 430/231 |
| 4,282,307 | 8/1981 | Bruder | 430/231 |
| 4,304,835 | 12/1981 | Bloom et al. | 430/231 |
| 5,445,915 | 8/1995 | Vaes | 430/231 |

FOREIGN PATENT DOCUMENTS 0694811  1/1996  European Pat. Off. .

*Primary Examiner*—Richard L. Schilling
*Attorney, Agent, or Firm*—Breiner & Breiner

[57] ABSTRACT

The present invention provides a method for obtaining an imaging element suitable for use in a silver salt diffusion transfer process comprising the steps of coating a support with a layer comprising physical development nuclei and a photosensitive layer comprising a photosensitive silver halide emulsion, said photosensitive layer being in water permeable relationship with said image receiving layer, characterized in that said physical development nuclei consist of a substantially homogeneous solid solution of two or more different metals and are prepared by pulsed high flux radiolysis.

According to the invention there is further provided a method for making a lithographic printing plate comprising the steps of image-wise exposing an imaging element prepared as defined above and subsequently developing a thus obtained image-wise exposed imaging element by means of an alkaline processing solution in the presence of a developing agent and a silver halide solvent.

11 Claims, No Drawings

METHOD FOR MAKING AN IMAGING ELEMENT AND A PRINTING PLATE ACCORDING TO THE SILVER SALT DIFFUSION TRANSFER PROCESS

DESCRIPTION

Benefit is claimed from U.S. provisional application Ser. No. 60/009,382 filed Dec. 29, 1995.

1. Field of the Invention

The present invention relates to a method for obtaining a silver salt diffusion transfer material and to a method for obtaining a lithographic printing plate therewith.

2. Background of the Invention

The principle of the silver complex diffusion transfer process (hereinafter referred to as DTR process) is well known from the description in U.S. Pat. No. 2,352,014 and in the book "Photographic Silver Halide Diffusion Processes" by André Rott and Edith Weyde—The Focal Press—London and New York, (1972).

In the DTR process, the silver complex is imagewise transferred by diffusion from a silver halide emulsion layer to an image receptive layer and transformed therein into a silver image generally in the presence of physical development nuclei. For this purpose, the imagewise exposed silver halide emulsion layer is arranged so as to be in contact with or is brought into contact with the image receptive layer in the presence of a developing agent and a solvent for the silver halide, thereby to convert the unexposed silver halide into a soluble silver complex. In the exposed areas of the silver halide emulsion layer, the silver halide is developed into silver which is insoluble and, hence, cannot diffuse. In the unexposed areas of the silver halide emulsion layer, the silver halide is converted into a soluble silver complex and is transferred to an image receptive layer wherein the silver complex forms a silver image generally in the presence of physical development nuclei.

The DTR-process can be used for making lithographic printing plates. A DTR-image bearing material can be used as a planographic printing plate wherein the DTR-silver image areas form the water-repellant ink-receptive areas on a water-receptive ink-repellant surface. The DTR-image can be formed in the image-receiving layer of a sheet or web material which is a separate element with respect to the photographic silver halide emulsion material (a so-called two-sheet DTR element) disclosed in e.g. DE-A-2.346.378 or in the image-receiving layer of a so-called single-support-element, also called mono-sheet element, which contains at least one photographic silver halide emulsion layer integral with an image-receiving layer in water permeable relationship therewith. It is the latter mono-sheet version which is preferred for the preparation of offset printing plates by the DTR method.

It is required that the printing plates obtained according to the DTR-process show a sensitometry with a low minimum density and a high gradient. A low minimum density is an indication for a printing plate with a high printing endurance. A high gradient is necessary for obtaining an image on the printing plate with good half-tone reproduction, what is one of the most important requirements for a good printing plate.

With respect to these requirements the state of the transferred silver i.e. the silver formed in the image-receiving layer plays a very important role. Parameters that are known to control the state of the transferred silver are e.g. the rate of development of the exposed silver halide (chemical development), rate of dissolution of the non-exposed silver halide by the silver halide solvent(s), rate of diffusion of the silver halide complexes, rate of development of the silver halide complexes in the image receiving layer (physical development) etc.. Although other factors such as for example the plate construction have an influence on the aforementioned parameters the type of physical development nuclei influences most of the mentioned parameters to a large extent.

Preferred physical development nuclei for use in an image accepting layer are sulfides of heavy metals e.g. sulfides of cobalt, lead, nickel, platinum and silver. Especially suitable physical development nuclei are palladium sulfide nuclei. Heavy metals, preferably silver, gold, platinum, palladium, and mercury in colloidal form are also used.

The use of said sulfides as physical development nuclei in an image accepting layer has a number of disadvantages. The synthesis of these compounds is hazardous, the coating layer of said compounds may have an obnoxious odour and sulfide salts in a layer in water permeable relationship with a silver halide containing layer may generate fog in said emulsion layer resulting in an image with white spots in the image areas or in a printing plate having non-printing spots in the printing areas.

The use of the presently known heavy metals in colloidal form as physical development nuclei in an image accepting layer has also a number of disadvantages. Aside from their high cost price, their reactivity as physical development nuclei in an image accepting layer is (too) low and their colloidal dispersions have a clear tendency to coagulation, causing a clustering of the colloids and a further lowering of their reactivity.

SUMMARY OF THE INVENTION

It is an object of the present invention to provide a method for obtaining an imaging element suitable for use in a silver salt diffusion transfer process for making a lithographic printing plate with excellent lithographic printing properties, with a lowered cost price and/or according to an ecological production process.

It is an object of the present invention to provide a method for obtaining a lithographic printing plate with excellent lithographic printing properties, with a lowered cost price and/or according to an ecological production process.

According to the present invention there is provided a method for obtaining an imaging element suitable for use in a silver salt diffusion transfer process comprising the steps of coating a support with an image receiving layer comprising physical development nuclei and a photosensitive layer comprising a photosensitive silver halide emulsion, said photosensitive layer being in water permeable relationship with said image receiving layer, characterized in that said physical development nuclei consist of a substantially homogeneous solid solution of two or more different metals and are prepared by pulsed high flux radiolysis.

According to the present invention there is provided a method for obtaining a lithographic printing plate according to the DTR-process by image-wise exposing an imaging element prepared as described above and developing said imaging element using an alkaline processing liquid in the presence of a developing agent and a silver halide solvent.

DETAILED DESCRIPTION OF THE INVENTION

It has been found that when a DTR-process is carried out in order to obtain a printing plate using an imaging element comprising on a support an image receiving layer containing physical development nuclei consisting of a substantially homogeneous solid solution of at least two metals and prepared by pulsed high flux radiolysis and a photosensitive layer comprising a photosensitive silver halide emulsion, said photosensitive layer being in water permeable relationship with said image receiving layer, said printing plate has a low minimum density and a high gradient.

JP-Pi 05-265.162I discloses a permeating, image receiving material for DTR characterized in that said material comprises physical nuclei having a structure in which to the surface of one reduced metal nucleus another reduced metal was attached.

U.S. Pat. No. 4,304,835 discloses the use as physical development nuclei of noble metal nuclei which can include the noble metal alloyed with another metal. However, in said patent is not disclosed that said noble metal forms a substantially homogeneous solution with said other metal.

From these disclosures there is nothing that suggest that nuclei containing a substantially homogeneous solid solution of at least two metals would be suitable as physical development nuclei in an image receiving layer.

EP-A 94202199.9 discloses the preparation of physical development nuclei consisting of a substantially homogeneous mixture of at least two metals. Said physical development nuclei are prepared by a continuous radiolysis and the reactivity of said physical development nuclei could use some improvement.

Nuclei containing a substantially homogeneous solid solution of at least two metals are nuclei wherein at most 60% of one metal in a nucleus is contained in less than 40% of the volume of the nucleus. Thus these nuclei are alloys comprising substantially homogeneous solid solution of the used metals, comprising only very small local heterogeneities in metal composition in one nucleus.

Preferably, between the nuclei in one image receiving layer the greatest difference in metal composition is lower than 20%, more preferably lower than 10% by weight.

The composition of the nuclei is determined by High Resolution Electron Miccroscopy and nanoprobe Energy Dispersive X-Ray Fluorescence (HREM-EDX) with a PHILIPS CM 20-EDAX as described by M. Yao et al. in Conference Abstracts, p. T-048 of "6$^{th}$ Internat. Symp. on Small Particles and Inorganic Clusters", The Univ. of Chicago, Ill., U.S.A., Sep. 15–22, 1992.

Preferably at least one of the metals comprised in the nuclei has an E° value of at least 0.75 V, preferably of at least 0.85 V, more preferably of at least 0.95 V. Such metals are e.g. Pd, Pt, Au, etc..

The E° value of the other metal or metals comprised in the nuclei is preferably at least −1 V, preferably at least −0.70 V, more preferably at least −0.40 V. Such metals are e.g. Ni, Cu, Co, Ag, etc..

The E° value of a metal is the standard reduction potential at 25° C. and 101.325 kPa with respect to the standard hydrogen electrode. A list of these values is given in e.a. "CRC Handbook of Chemistry and Physics"—74$^{th}$ Ed.— CRC Press—London.

The molar ratio in the nuclei between the metal having the highest E° value and (the sum of) the other metal(s) ranges from 10:1 to 1:10, more preferably from 5:1 to 1:5, most preferably from 2:1 to 1:2.

Preferably the physical development nuclei according to the invention contained in said receiving layer have a number average diameter less than 10 nm, more preferably less than 8 nm, most preferably less than 6.5 nm.

Although the size of the nuclei above is expressed by a diameter this does not imply that the nuclei are necessarily spherical. By diameter is meant the diameter of a sphere having the same volume as the nucleus so that the size of nuclei of a variety of shapes can be characterized by the same parameter.

The physical development nuclei according to the invention are preferably used in the presence of a water soluble polymer such as polyvinyl alcohol, polyvinyl acrylic acid, polyvinyl acrylamide etc.. The ratio in weight between the physical development nuclei and the water soluble polymer ranges from 1:1000 to 10:1, more preferably from 1:100 to 1:1.

The physical development nuclei according to the present invention are prepared by pulsed high flux radiolysis. For example an aqueous solution containing between $10^{-4}$ mole/l and $10^{-1}$ mole/l of a water soluble salt of the metal with the highest E° value and an amount of (a) water soluble salt(s) of the metal(s) with the lower E° value also between $10^{-4}$ mole/l and $10^{-3}$ mole/l, between $10^{-1}$ mole/l and 1 mole/l of an electron scavenger such as isopropanol or $HCO_2Na$, between 2 g/l and 20 g/l of a water soluble polymer such as polyvinyl alcohol or polyacrylic acid, at a pH range from 2 to 12 and at a temperature range from 15° C. to 60° C. was subjected to radiolysis by a pulsed high flux radiolysis source. Such pulsed high flux radiolysis source can be an electron accelerator having a power between 5 and 500 kW and delivering electrons with an energy between 1 and 10 MeV and a dose rate between 0.5 and 200 $kGy.s^{-1}$. This dose rate is between 100 and 10000 times the dose rate of a continuous radiolysis source such as a source of gamma rays radiolysis. The pulse time ranges from 3 µs to 50 µs and the pulse frequency ranges from 10 to 350 Hz.

The obtained nuclei can be stabilized using a stabilizer. Suitable stabilizers are large organic molecules that readily adsorb to the surface of the nuclei. Examples are heterocyclic compounds containing a water solubilizing group such as —COOH, —$SO_3H$ or —$SO_2H$ e.g. tetrazoles containing a water solubilizing group as described in e.g. EP-A 218752.

The amount of nuclei used in the image receiving layer is preferably between 0.02 mg/m$^2$ and 20 mg/m$^2$, more preferably between 0.04 mg/m$^2$ and 10 mg/m$^2$, most preferably between 0.08 mg/m$^2$ and 5 mg/m$^2$.

According to one preferred embodiment of the present invention a lithographic printing plate can be obtained by means of the DTR-process using an imaging element comprising on a support in the order given a silver halide emulsion layer and a layer containing physical development nuclei in accordance with the invention said layer containing physical development nuclei being in water permeable relationship with said emulsion layer.

Layers being in waterpermeable contact with each other are layers that are contiguous to each other or only separated from each other by (a) waterpermeable layer(s). The nature of a waterpermeable layer is such that it does not substantially inhibit or restrain the diffusion of water or of compounds contained in an aqueous solution e.g. developing agents or the complexed silver.

Supports suitable for use in accordance with the present invention may be opaque or transparent, e.g. a paper support or resin support. When a paper support is used preference is given to one coated at one or both sides with an Alpha-olefin polymer. It is also possible to use an organic resin support e.g. poly(ethylene terephthalate) film or poly-Alpha-olefin films. The thickness of such organic resin film is preferably comprised between 0.07 and 0.35 mm. These organic resin supports are preferably coated with a hydrophilic adhesion layer which can contain water insoluble particles such as silica or titanium dioxide. Metal supports e.g. aluminum may also be used in accordance with the present invention.

The photosensitive layer used according to the present invention may be any layer comprising a hydrophilic colloid binder and at least one silver halide emulsion, at least one of the silver halide emulsions being photosensitive.

The photographic silver halide emulsion(s) used in accordance with the present invention can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

For use according to the present invention the silver halide emulsion or emulsions preferably consist principally of silver chloride while a fraction of silver bromide may be present ranging from 1 mole % to 40 mole %. Most preferably a silver halide emulsion containing at least 70 mole % of silver chloride is used.

The average size of the silver halide grains may range from 0.10 to 0.70 µm, preferably from 0.25 to 0.45 µm.

Preferably during or after the precipitation stage iridium and/or rhodium containing compounds or a mixture of both are added. The concentration of these added compounds ranges from $10^{-8}$ to $10^{-3}$ mole per mole of $AgNO_3$, preferably between $10^{-7}$ and $10^{-5}$ mole per mole of $AgNO_3$.

The emulsions can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-P 493,464 and 568,687, and polyamines such as diethylene triamine or derivatives of aminomethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R.KOSLOWSKY, Z. Wiss. Photogr. Photophys. Photochem. 46, 65–72 (1951).

Apart from negative-working silver halide emulsions that are preferred for their high photosensitivity, use can be made also of direct-positive silver halide emulsions that produce a positive silver image in the emulsion layer(s) and a negative image on the image-receiving layer.

Suitable direct positive silver halide emulsions for use in accordance with the present invention are silver halide emulsions that have been previously fogged or that mainly form an internal latent image.

Internal latent image-type silver halide emulsions that can be used in accordance with the present invention have been described in e.g. U.S. Pat. Nos. 2,592,250, 3,206,313, 3,271, 157, 3,447,927, 3,511,662, 3,737,313, 3,761,276, GB-A 1,027,146, and JA Patent Publication No. 34,213/77. However, the silver halide emulsions used in the present invention are not limited to the silver halide emulsions described in these documents.

The other type of direct positive type silver halide emulsions for use in accordance with the present invention, which is of the previously fogged type, may be prepared by overall exposing a silver halide emulsion to light and/or by chemically fogging a silver halide emulsion. Chemical fog specks may be formed by various methods for chemical sensitization.

Chemical fogging may be carried out by reduction or by a compound which is more electropositive than silver e.g. gold salts, platinum salts, iridium salts etc., or a combination of both. Reduction fogging of the silver halide grains may occur by high pH and/or low pAg silver halide precipitation or digestion conditions e.g. as described by Wood J. Phot. Sci. 1 (1953), 163 or by treatment with reducing agents e.g. tin(II) salts which include tin(II)chloride, tin complexes and tin chelates of (poly)amino(poly)carboxylic acid type as described in British Patent 1,209,050, formaldehyde, hydrazine, hydroxylamine, sulphur compounds e.g. thiourea dioxide, phosphonium salts e.g. tetra(hydroxymethyl)-phosphonium chloride, polyeunines e.g. diethylenetriamine, bis(p-aminoethyl)sulfide and its water-soluble salts, hydrazine derivatives, alkali arsenite, amine borane etc. or mixtures thereof.

When fogging of the silver halide grains occurs by means of a reducing agent e.g. thiourea dioxide and a compound of a metal more electropositive than silver especially a gold compound, the reducing agent is preferably used initially and the gold compound subsequently. However, the reverse order can be used or both compounds can be used simultaneously.

In addition to the above described methods of chemically fogging chemical fogging can be attained by using said fogging agents in combination with a sulphur-containing sensitizer, e.g. sodium thiosulphate or a thiocyanic acid compound e.g. potassium thiocyanate.

The silver halide emulsions of the DTR-element can be spectrally sensitized according to the spectral emission of the exposure source for which the DTR element is designed.

Suitable sensitizing dyes for the visible spectral region include methine dyes such as those described by F. M. Hamer in "The Cyanine Dyes and Related Compounds", 1964, John Wiley & Sons. Dyes that can be used for this purpose include cyanine dyes, merocyanine dyes, complex cyanine dyes, complex merocyanine dyes, homopolar cyanine dyes, hemicyanine dyes, styryl dyes and hemioxonol dyes. Particularly valuable dyes are those belonging to the cyanine dyes, merocyanine dyes, complex merocyanine dyes.

In the case of a conventional light source, e.g. tungsten light, a green sensitizing dye is needed. In case of exposure by an argon ion laser a blue sensizing dye is incorporated. In case of exposure by a red light emitting source, e.g. a LED or a HeNe laser a red sensitizing dye is used. In case of exposure by a semiconductor laser special spectral sensitizing dyes suited for the near infra-red are required. Suitable infra-red sensitizing dyes are disclosed in i.a. U.S. Pat. Nos. 2,095,854, 2,095,856, 2,955,939, 3,482,978, 3,552,974, 3,573,921, 3,582,344, 3,623,881 and 3,695,888.

A preferred blue sensitizing dye, green sensitizing dye, red sensitizing dye and infra-red sensitizing dye in connection with the present invention are described in EP-A 554,585.

To enhance the sensitivity in the red or near infra-red region use can be made of so-called supersensitizers in combination with red or infra-red sensitizing dyes. Suitable supersensitizers are described in Research Disclosure Vol 289, May 1988, item 28952. The spectral sensitizers can be added to the photographic emulsions in the form of an aqueous solution, a solution in an organic solvent or in the form of a dispersion.

The silver halide emulsions may contain the usual emulsion stabilizers. Suitable emulsion stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable emulsion stabilizers are i.a. heterocyclic mercapto compounds.

The silver halide emulsions may contain pH controlling ingredients. Preferably the emulsion layer is coated at a pH value near the isoelectric point of the gelatin to improve the stability characteristics of the coated layer. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. Nos. 4,092,168, 4,311,787 and DE-P 2,453,217.

More details about the composition, preparation and coating of silver halide emulsions suitable for use in accordance with the present invention can be found in e.g. Product Licensing Index, Vol. 92, December 1971, publication 9232, p. 107–109.

In addition to the above described emulsion layer and image receiving layer other hydrophilic colloid layers in water permeable relationship with these layers may be present. For example it is especially advantageous to include a base-layer between the support and the photosensitive silver halide emulsion layer. In a preferred embodiment said base-layer serves as an antihalation layer. On the other hand, in order to gain sensitivity, light reflecting pigments, e.g. titaniumdioxide can be present. Further this layer can contain hardening agents, matting agents, e.g. silica particles, and wetting agents. At least part of these matting agents and/or light reflection pigments may also be present in the silver halide emulsion layer the most part however preferably being present in said base-layer. As a further alternative the light reflecting pigments may be present in a separate layer provided between the antihalation layer and the photosensitive silver halide emulsion layer.

In a preferred embodiment in connection with this photographic material a backing layer is provided at the non-light sensitive side of the support. This layer which can serve as anti-curl layer can contain i.a. matting agents e.g. silica particles, lubricants, antistatic agents, light absorbing dyes, opacifying agents, e.g. titanium oxide and the usual ingredients like hardeners and wetting agents. The backing layer can consist of one single layer or a double layer pack.

The hydrophilic layers usually contain gelatin as hydrophilic colloid binder. Mixtures of different gelatins with different viscosities can be used to adjust the rheological properties of the layer. Like the emulsion layer the other hydrophilic layers are coated preferably at a pH value near the isoelectric point of the gelatin. But instead of or together with gelatin, use can be made of one or more other natural and/or synthetic hydrophilic colloids, e.g. albumin, casein, zein, polyvinyl alcohol, alginic acids or salts thereof, cellulose derivatives such as carboxymethyl cellulose, modified gelatin, e.g. phthaloyl gelatin etc.

The hydrophilic layers of the photographic element, especially when the binder used is gelatin, can be hardened with appropriate hardening agents such as those of the vinylsulfone type e.g. methylenebis(sulfonylethylene), aldehydes e.g. formaldehyde, glyoxal, and glutaraldehyde, N-methylol compounds e.g. dimethylourea and methyloldimethylhydantoin, active halogen compounds e.g. 2,4-dichloro-6-hydroxy-s-triazine, and mucohalogenic acids e.g. mucochloric acid and mucophenoxychloric acid. These hardeners can be used alone or in combination. The binders can also be hardened with fast-reacting hardeners such as carbamoylpyridinium salts of the type, described in U.S. Pat. No. 4,063,952.

Preferably used hardening agents are of the aldehyde type. The hardening agents can be used in wide concentration range but are preferably used in an amount of 4% to 7% of the hydrophilic colloid. Different amounts of hardener can be used in the different layers of the imaging element or the hardening of one layer may be adjusted by the diffusion of a hardener from another layer.

The imaging element used according to the present invention may further comprise various kinds of surface-active agents in the photographic emulsion layer or in at least one other hydrophilic colloid layer. Suitable surface-active agents include non-ionic agents, anionic agents comprising an acid group, ampholytic agents and cationic agents. Preferably compounds containing perfluorinated alkyl groups are used.

This photographic material suitable for use in the present invention may further comprise various other additives such as e.g. compounds improving the dimensional stability of the photographic element, UV-absorbers, spacing agents and plasticizers.

Suitable additives for improving the dimensional stability of the photographic element are e.g. dispersions of a water-soluble or hardly soluble synthetic polymer e.g. polymers of alkyl (meth)acrylates, alkoxy(meth)acrylates, glycidyl (meth)acrylates, (meth)acrylamides, vinyl esters, acrylonitriles, olefins, and styrenes, or copolymers of the above with acrylic acids, methacrylic acids, alpha-beta-unsaturated dicarboxylic acids, hydroxyalkyl (meth)acrylates, sulphoalkyl (meth)acrylates, and styrene sulphonic acids.

The imaging element according to said embodiment may be imaged by means of a wide choice of cameras, existing on the market. Horizontal, vertical and darkroom type cameras and contact-exposure apparatus are available to suit any particular class of reprographic work. The imaging element can also be exposed in accordance with the present invention with the aid of i.a. laser recorders and cathode ray tubes.

Subsequently, said photographic material is developed with the aid of an aqueous alkaline solution in the presence of (a) developing agent(s) and (a) silver halide solvent(s).

The alkaline processing liquid used for developing the imaging element in accordance with the method of the present invention preferably contains a silver halide solvent. Preferably the silver halide solvent is used in an amount between 0.01% by weight and 10% by weight and more preferably between 0.05% by weight and 8% by weight. Suitable silver halide solvents for use in connection with the present invention are e.g. 2-mercaptobenzoic acid, cyclic imides, oxazolidones and thiosulfates. Silver halide solvents that are preferably used in connection with the present invention are thiocyanates and alkanolamines.

Alkanolamines that are suitable for use in connection with the present invention may be of the tertiary, secundary or primary type. Examples of alkanolamines that may be used in connection with the present invention correspond to the following formula:

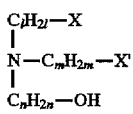

wherein X and X' independently represent hydrogen, a hydroxyl group or an amino group, l and m represent 0 or integers of 1 or more and n represents an integer of 1 or more. Preferably used alkanolamines are e.g. N-(2-aminoethyl)ethanolamine, diethanolamine, N-methylethanolamine, triethanolamine, N-ethyldiethanolamine, diisopropanolamine, ethanolamine, 4-aminobutanol, N,N-dimethylethanolamine, 3-aminopropanol, N,N-ethyl-2,2'-iminodiethanol, 2-aminoethyl-aminoethanol etc. or mixtures thereof.

According to the present invention the alkanolamines are preferably present in the alkaline processing liquid. However part or all of the alkanolamine can be present in one or more layers of the imaging element.

A further suitable type of silver halide solvents are thioether compounds. Preferably used thioethers correspond to the following general formula:

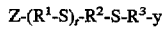

wherein Z and Y each independently represents hydrogen, an alkyl group, an amino group, an ammonium group, a hydroxyl, a sulfo group, a carboxyl, an aminocarbonyl or an aminosulfonyl, $R^1$, $R^2$ and $R^3$ each independently represents an alkylene that may be substituted and optionally contain an oxygen bridge and t represents an integer from 0 to 10. Examples of thioether compounds corresponding to the above formula are disclosed in e.g. U.S. Pat. No. 4,960,683 and EP-A 547,662, which therefor are incorporated herein by reference.

Still further suitable silver halide solvents are meso-ionic compounds. Preferred meso-ionic compounds for use in connection with the present invention are triazolium thiolates and more preferred 1,2,4-triazolium-3-thiolates.

According to a preferred embodiment of the present invention at least part and most preferably all of the meso-ionic compound is present in the alkaline processing liquid used for developing the image-wise exposed imaging element. Preferably the amount of meso-ionic compound in the alkaline processing liquid is between 0.1 mmol/l and 25 mmol/l and more preferably between 0.5 mmol/l and 15 mmol/l and most preferably between 1 mmol/l and 8 mmol/l.

However the meso-ionic compound may be incorporated in one or more layers comprised on the support of the imaging element. The meso-ionic compound is in that case preferably contained in the imaging element in a total amount between 0.1 and 10 mmol/m², more preferably between 0.1 and 5 mmol/m² and most preferably between 0.5 and 1.5 mmol/m². More details are disclosed in EP-A-0,554,585

The alkaline processing liquid used in accordance with the present invention preferably has a pH between 9 and 14 and more preferably between 10 and 13. Said pH may be established by an organic or inorganic alkaline substance or a combination thereof. Suitable inorganic alkaline substances are e.g. potassium or sodium hydroxide, carbonate, phosphate etc.. Suitable organic alkaline substances are e.g. alkanolamines. In the latter case the alkanolamines will provide or help maintain the pH and serve as a silver halide complexing agent.

The alkaline processing liquid may also contain (a) developing agent(s). In this case the alkaline processing liquid is called a developer. On the other hand some or all of the developing agent(s) may be present in one or more layers of the photographic material or imaging element. When all of the developing agents are contained in the imaging element the alkaline processing liquid is called an activator or activating liquid.

Silver halide developing agents for use in accordance with the present invention are preferably of the p-dihydroxybenzene type, e.g. hydroquinone, methylhydroquinone or chlorohydroquinone, preferably in combination with an auxiliary developing agent being a 1-phenyl-3-pyrazolidone-type developing agent and/or p-monomethylaminophenol. Particularly useful auxiliary developing agents are the 1-phenyl-3-pyrazolidones. Even more preferred, particularly when they are incorporated into the photographic material are 1-phenyl-3-pyrazolidones of which the aqueous solubility is increased by a hydrophilic substituent such as e.g. hydroxy, amino, carboxylic acid group, sulphonic acid group etc.. Examples of 1-phenyl-3-pyrazolidones substituted with one or more hydrophilic groups are e.g. 1-phenyl-4,4-dimethyl-2-hydroxy-3-pyrazolidone, 1-(4-carboxyphenyl)-4,4-dimethyl-3-pyrazolidone etc.. However other developing agents can be used.

At least the auxiliary developing agents are preferably incorporated into the photographic material, preferably in the silver halide emulsion layer of the photographic material, in an amount of less than 150 mg/g of silver halide expressed as $AgNO_3$, more preferably in an amount of less than 100 mg/g of silver halide expressed as $AgNO_3$.

According to the present invention the alkaline processing liquid used for developing an imaging element as described above preferably also contains hydrophobizing agents for improving the hydrophobicity of the silver image obtained in the image receiving layer. The hydrophobizing agents used in connection with the present invention are compounds that are capable of reacting with silver or silver ions and that are hydrophobic i.e. insoluble in water or only slightly soluble in water. Generally these compounds contain a mercapto group or thiolate group and one or more hydrophobic substituents e.g. an alkyl group containing at least 3 carbon atoms. Examples of hydrophobizing agents for use in accordance with the present invention are e.g. those described in U.S. Pat. No. 3,776,728, and U.S. Pat. No. 4,563,410. Preferred compounds correspond to one of the following formulas:

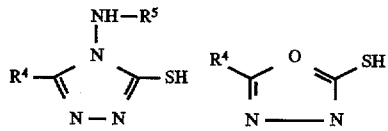

wherein $R^5$ represents hydrogen or an acyl group, $R^4$ represents alkyl, aryl or aralkyl. Most preferably used compounds are compounds according to one of the above formulas wherein $R^4$ represents an alkyl containing 3 to 16 C-atoms.

According to the present invention the hydrophobizing agents are contained in the alkaline processing liquid in an amount of at least 0.1 g/l, more preferably at least 0.2 g/l and most preferably at least 0.3 g/l. The maximum amount of hydrophobizing agents will be determined by the type of hydrophobizing agent, type and amount of silver halide solvents etc.. Typically the concentration of hydrophobizing agent is preferably not more than 1.5 g/l and more preferably not more than 1 g/l.

The alkaline processing liquid preferably also contains a preserving agent having antioxidation activity, e.g. sulphite ions provided e.g. by sodium or potassium sulphite. For example, the aqueous alkaline solution comprises sodium sulphite in an amount ranging from 0.15 to 1.0 mol/l. Further may be present a thickening agent, e.g. hydroxyethylcellulose and carboxymethylcellulose, fog inhibiting agents, e.g. potassium bromide, potassium iodide and a benzotriazole which is known to improve the printing endurance, calcium-sequestering compounds, anti-sludge agents, and hardeners including latent hardeners. In accordance with the present invention it is furthermore preferred to use a spreading agent or surfactant in the alkaline processing liquid to assure equal spreading of the alkaline processing liquid over the surface of the photographic material. Such a surfactant should be stable at the pH of the alkaline processing liquid and should assure a fast overall wetting of the surface of the photographic material. A surfactant suitable for such purpose is e.g. a fluor containing surfactant such as e.g. $C_7F_{15}COONH_4$. It is furthermore advantageous to add glycerine to the alkaline processing liquid so as to prevent crystallization of dissolved components of said alkaline processing liquid.

Development acceleration can be accomplished by addition of various compounds to the alkaline processing liquid and/or one or more layers of the photographic element, preferably polyalkylene derivatives having a molecular weight of at least 400 such as those described in e.g. U.S. Pat. Nos. 3,038,805, 4,038,075, 4,292,400, 4,975,354.

Subsequent to the development in an alkaline processing liquid in accordance with the present invention the surface of the printing plate is preferably neutralized using a neutralization liquid.

A neutralization liquid generally has a pH between 5 and 8. The neutralization liquid preferably contains a buffer e.g. a phosphate buffer, a citrate buffer or mixture thereof. The neutralization solution can further contain bactericides, substances which influence the hydrophobic/hydrophilic balance of the printing plate obtained after processing of the DTR element, e.g. hydrophobizing agents as described above, silica and wetting agents, preferably compounds containing perfluorinated alkyl groups.

A lithographic plate is thus obtained.

According to another preferred embodiment of the present invention a lithographic printing plate can be obtained by means of the DTR-process using an imaging element comprising in the order given a hydrophilic surface of a support, an image receiving layer containing physical development nuclei according to the invention and a silver halide emulsion layer in water permeable relationship with said image receiving layer.

Said hydrophilic surface of a support can be a hardened hydrophilic layer, containing a hydrophilic binder and a hardening agent coated on a flexible support.

Such hydrophilic binders are disclosed in e.g. EP-A 450,199, which therefor is incorporated herein by reference. Preferred hardened hydrophilic layers comprise partially modified dextrans or pullulan hardened with an aldehyde as disclosed in e.g. EP-A 514,990 which therefor is incorporated herein by reference. More preferred hydrophilic layers are layers of polyvinyl alcohol hardened with a tetraalkyl orthosilicate and preferably containing $SiO_2$ and/or $TiO_2$ wherein the weight ratio between said polyvinylalcohol and said tetraalkyl orthosilicate is between 0.5 and 5 as disclosed in e.g. GB-P 1,419,512, FR-P 2,300,354, U.S. Pat. No. 3,971,660, U.S. Pat. No. 4,284,705, EP-A 405,016 and EP-A 450,199 which therefor are incorporated herein by reference.

Flexible supports e.g. a paper support or a resin support are described above.

Said hydrophilic surface of a support is preferably a hydrophilic metallic support e.g. an aluminum foil.

The aluminum support of the imaging element for use in accordance with the present invention can be made of pure aluminum or of an aluminum alloy, the aluminum content of which is at least 95%. The thickness of the support usually ranges from about 0.13 to about 0.50 mm.

The preparation of aluminum or aluminum alloy foils for lithographic offset printing comprises the following steps: graining, anodizing, and optionally sealing of the foil.

Graining and anodization of the foil are necessary to obtain a lithographic printing plate that allows to produce high-quality prints in accordance with the present invention. Sealing is not necessary but may still improve the printing results. Preferably the aluminum foil has a roughness with a CLA value between 0.2 and 1.5 µm, an anodization layer with a thickness between 0.4 and 2.0 µm and is sealed with an aqueous bicarbonate solution.

According to the present invention the roughening of the aluminum foil can be performed according to the methods well known in the prior art. The surface of the aluminum substrate can be roughened either by mechanical, chemical or electrochemical graining or by a combination of these to obtain a satisfactory adhesiveness of a silver halide emulsion layer to the aluminum support and to provide a good water retention property to the areas that will form the non-printing areas on the plate surface.

The electrochemical graining process is preferred because it can form a uniform surface roughness having a large average surface area with a very fine and even grain which is commonly desired when used for lithographic printing plates.

Electrochemical graining can be conducted in a hydrochloric and/or nitric acid containing electrolyte solution using an alternating or direct current. Other aqueous solutions that can be used in the electrochemical graining are e.g. acids like $H_2SO_4$, $H_3PO_4$, that if desired, contain additionally one or more corrosion inhibitors such as $Al(NO_3)_3$, $AlCl_3$, boric acid, chromic acid, sulfates, chlorides, nitrates, monoamines, diamines, aldehydes, phosphates, $H_2O_2$, etc. ...

Electrochemical graining in connection with the present invention can be performed using single-phase and three-phase alternating current. The voltage applied to the aluminum plate is preferably 10–35 V. A current density of 3–150 Amp/dm$^2$ is employed for 5–240 seconds. The temperature of the electrolytic graining solution may vary from 5°–50° C. Electrochemical graining is carried out preferably with an alternating current from 10 Hz to 300 Hz.

The roughening is preferably preceded by a degreasing treatment mainly for removing fatty substances from the surface of the aluminum foil.

Therefore the aluminum foil may be subjected to a degreasing treatment with a surfactant and/or an aqueous alkaline solution.

Preferably roughening is followed by a chemical etching step using an aqueous solution containing an acid. The chemical etching is preferably carried out at a temperature of at least 30° C. more preferably at least 40° C. and most preferably at least 50° C.

Suitable acids for use in the aqueous etch solution are preferably inorganic acids and most preferably strong acids. The total amount of acid in the aqueous etch solution is preferably at least 150 g/l. The duration of chemical etching is preferably between 3 s and 5 min.

After roughening and optional chemical etching the aluminum foil is anodized which may be carried out as follows.

An electric current is passed through the grained aluminum foil immersed as an anode in a solution containing sulfuric acid, phosphoric acid, oxalic acid, chromic acid or organic acids such as sulfamic, benzosulfonic acid, etc. or mixtures thereof. An electrolyte concentration from 1 to 70% by weight can be used within a temperature range from 0°–70° C. The anodic current density may vary from 1–50 A/dm$^2$ and a voltage within the range 1–100 V to obtain an anodized film weight of 1–8 g/m$^2$ Al$_2$O$_3$.H$_2$O. The anodized aluminum foil may subsequently be rinsed with demineralised water within a temperature range of 10°–80° C.

After the anodizing step sealing may be applied to the anodic surface. Sealing of the pores of the aluminum oxide layer formed by anodization is a technique known to those skilled in the art of aluminum anodization. This technique has been described in e.g. the "Belgisch-Nederlands tijdschrift voor Oppervlaktetechnieken van materialen", 24ste jaargang/januari 1980, under the title "Sealing-kwaliteit en sealing-controle van geanodiseerd Aluminum". Different types of sealing of the porous anodized aluminum surface exist.

Preferably, said sealing is performed by treating a grained and anodized aluminum support with an aqueous solution containing a bicarbonate as disclosed in EP-A 567178, which therefor is incorporated herein by reference.

Preferably each of the above described steps is separated by a rinsing step to avoid contamination of the liquid used in a particular step with that of the preceding step.

To promote the image sharpness and, as a consequence thereof, the sharpness of the final printed copy, the anodization layer may be coloured in the mass with an antihalation dye or pigment e.g. as described in JA-Pu-58-14,797.

The imaging element of the present embodiment may be imaged using a camera-exposure or a scanning exposure as described above followed by a development step in the presence of development agent(s) and silver halide solvent (s) according to the invention so that a silver image is formed in the physical development nuclei layer. Subsequently the silver halide emulsion layer and any other optional hydrophilic layers are removed by e.g. rinsing the imaged element with water, preferably between 30° C. and 50° C. so that the silver image is exposed.

To facilate the removal of the silver halide emulsion layer it is advantageous to provide a layer between the hydrophilic surface of a support and the silver halide emulsion layer comprising a hydrophilic non-proteinic film-forming polymer e.g. polyvinyl alcohol, polymer beads e.g. poly(meth) acrylate beads or mixtures thereof. Such type of layers are disclosed in EP-A-483415 and EP-A-410500.

Finally said exposed imaged surface of the hydrophilic support is treated with a finisher to enhance the water-receptivity of the non-image areas and to make the image areas oleophilic ink-receptive.

The lithographic composition often called finisher comprises at least one compound enhancing the ink-receptivity and/or lacquer-receptivity of the silver image and at least one compound that improves the ink-repelling characteristics of the hydrophilic surface.

Suitable ingredients for the finisher are e.g. organic compounds containing a mercapto group such as the hydrophobizing compounds referred to hereinbefore for the alkaline solution. Said (a) hydrophobizing agent(s) is(are) comprised in the finisher preferably in a total concentration between 0.1 g/l and 10 g/l, more preferably in a total concentration between 0.3 g/l and 3 g/l.

Additives improving the oleophilic ink-repellency of the hydrophilic surface areas are e.g. carbohydrates such as acid polysaccharides like gum arabic, carboxymethylcellulose, sodium alginate, propylene glycol ester of alginic acid, hydroxyethyl starch, dextrin, hydroxyethylcellulose, polyvinyl pyrrolidone, polystyrene sulphonic acid, polyvinyl alcohol and preferably polyglycols, being the reaction products of ethyleneoxide and/or propyleneoxide with water or an alcohol. Optionally, hygroscopic substances e.g. sorbitol, glycerol, tri(hydroxyethyl)ester of glycerol, and turkish red oil may be added.

The following examples illustrate the present invention without limiting it thereto. All percentages are by weight unless stated otherwise.

EXAMPLE 1

Preparation of the physical development nuclei a to f

An aqueous solution containing 0.0005 mole/l of NiSO$_4$ and 0.0005 mole/l of K$_2$PtCl$_6$ (solutions of a and of b), respectively 0.0005 mole/l of HAuCl$_4$ and 0.0005 mole/l of CuSO$_4$ (solutions of c and of d), respectively 0.00015 mole/l of Ag$_2$SO$_4$ and 0.0003 mole/l of CuSO$_4$ and 0.0003 mole/l of PdCl$_2$ (solutions of e and of f), 0.2 mole/l isopropanol as electron scavenger and 7.2 g polyacrylic acid as water soluble polymer was brought at a pH of 10 by the addition of NH$_4$OH for the solutions a to d and left at a pH of 3 for the solutions E and f and then subjected to radiolysis either by a continuous source (solutions of a, of c and of e) or by a pulsed high dose rate source (solutions of b, of d and of f). As continuous source is used a γ source of $^{60}$Co with an energy of about 1 MeV and a dose capacity of 0.0083 kGy.s$^{-1}$. As pulsed high flux source is used an electron accelerator with a power of 20 kW, delivering electrons with an energy of 10 MeV and a dose rate of 2.2 kGy.s$^{-1}$, a pulse time of 14 μs and a pulse frequency of 100 Hz.

Preparation of a silver halide emulsion:

A silver chlorobromide emulsion composed of 98.2% of chloride and 1.8% of bromide was prepared by the double jet precipitation method. The average silver halide grain size was 0.4 μm (diameter of a sphere with equivalent volume) and contained Rhodium ions as internal dopant. The emulsion was orthochromatically sensitized and stabilized by 1-phenyl-5-mercapto-tetrazole.

A base layer coating solution was prepared having the following composition:

| | |
|---|---|
| gelatin | 5.5% |
| carbon black | 0.76% |
| silica particles (5 μm) | 1.6% |

Preparation of the imaging element:

The silver halide emulsion coating solution was coated simultaneously with the base layer coating solution by means of the cascade coating technique to a polyethylene terephthalate support provided with a pack of two backing layers such that the base layer coating was coated directly to the side of the support opposite to the side containing said backing layers. The silver halide emulsion layer was coated such that the silver halide coverage expressed as AgNO$_3$ was 1.5 g/m$^2$ and the gelatin content was 1.5 g/m$^2$. The silver halide emulsion layer further contained 0.15 g/m$^2$ of 1-phenyl-4,4'-dimethyl-3-pyrazolidone, 0.25 g/m$^2$ of hydroquinone, 1.25 mg/m$^2$ of 1-phenyl-5-mercapto-tetrazole, 2.2 mg/m$^2$ of 4-hydroxy-6-methyl-1,3,3a,7-tetraazaindene and 8.4 mg/m$^2$ of 7-sulpho-nafto-(2,3-d)- oxazolidine-2-thione. The base layer was coated such that the amount of gelatin in the coated layer was 3 g/m².

The layer nearest to the support of the backing layer pack contained 0.3 g/m² of gelatin and 0.5 g/m² of the antistatic agent co(tetraallyloxyethane/methacrylate/acrylic acid-K-salt) polymer. The second backing layer contained 4 g/m² of gelatin, 0.15 g/m² of a matting agent consisting of transparent spherical polymeric beads of 3 micron average diameter according to EP-A-080,225, 0.05 g/m² of hardening agent triacrylformal and 0.021 g/m² of wetting agent $F_{15}C_7$-COONH$_4$.

Six thus obtained elements were dried and subjected to a temperature of 40° C. for 5 days and then the silver halide emulsion layers were overcoated with a layer containing respectively the physical development nuclei a, b, e and f at $5.07*10^{-5}$ mole/m² and the physical development nuclei c and d at $1.27*10^{-5}$ mole/m², hydroquinone at 0.4 g/m² and formaldehyde at 100 mg/m² to yield respectively the imaging elements I, II, V, VI, III and IV.

The following processing solutions were prepared:

| Activator | |
| --- | --- |
| potassium hydroxide (g) | 30 |
| sodium sulphite anh. (g) | 35 |
| 1,5-dimethyl-4-allyl 1,2,4-triazolium-3-thiolate (mg) | 1000 |
| 2-Aminoethyl-aminoethanol (g) | 10 |
| 2-mercapto-5-n.heptyl-oxa-3,4-diazole (mg) | 300 |
| water to make | 1 l |
| Neutralization solution | |
| citric acid | 10 g |
| sodium citrate | 35 g |
| sodium sulphite anh. | 5 g |
| phenol | 50 mg |
| water to make | 1 l |

The above described imaging elements I to VI were image-wise exposed and processed with the above described activator for 10 seconds at 30° C., subsequently neutralized at 25° C. with the neutralization solution described above and dried to give the printing plates 1 to 6.

The sensitometric properties of these printing plates were characterized by the minimum and maximum reflection density and the gradient measured between the points 25% above the minimum density and 25% below the maximum density. The results are given in table 1.

TABLE 1

| No$^a$ | Composition$^b$ | Preparation$^c$ | Dmin | Dmax | G25/75$^d$ |
| --- | --- | --- | --- | --- | --- |
| 1 | NiPt | cont. | 0.89 | 1.32 | 1.19 |
| 2 | NiPt | pulsed | 0.62 | 1.32 | 2.56 |
| 3 | AuCu | cont. | 0.73 | 1.32 | 1.69 |
| 4 | AuCu | pulsed | 0.61 | 1.32 | 2.43 |
| 5 | AgPdCu | cont. | 0.66 | 1.32 | 2.18 |
| 6 | AgPdCu | pulsed | 0.61 | 1.32 | 2.47 |

Remarks:
$^a$No: is the number of the printing plate.
$^b$is the composition of the physical developing nuclei of said printing plate.
$^c$preparation relates to the way said physical developing nuclei were prepared, either by continuous radiation (cont.) or by pulsed high flux radiolysis (pulsed).
$^d$G25/75: the gradient of the sensitometric curve of the printing plate between the points 25% above the minimum density and 25% below the maximum density.

Evaluation:

The results listed in table 1 prove that the minimum density of a printing plate obtained from an imaging element comprising physical developing nuclei prepared by pulsed high flux radiolysis is always lower (sometimes outspokenly lower) than the minimum density of a printing plate obtained from an imaging element comprising physical developing nuclei prepared by continuous radiolysis. A lower minimum density is an indication for a higher printing endurance.

Also, these results prove that the gradient of a printing plate obtained from an imaging element comprising physical developing nuclei prepared by pulsed high flux radiolysis is always higher (sometimes outspokenly higher) than the gradient of a printing plate obtained from an imaging element comprising physical developing nuclei prepared by continuous radiolysis. A higher gradient facilitates the obtaining of an image on the printing plate with good half-tone reproduction.

We claim:

1. A method for obtaining an imaging element suitable for use in a silver salt diffusion transfer process comprising the steps of coating a support with an image receiving layer comprising physical development nuclei and a photosensitive layer comprising a photosensitive silver halide emulsion, said photosensitive layer being in water permeable relationship with said image receiving layer, characterized in that said physical development nuclei consist of a substantially homogeneous solid solution of two or more different metals and are prepared by pulsed high flux radiolysis.

2. A method according to claim 1 wherein at least one of said metals has an E° value of at least 0.75 V.

3. A method according to claim 2 wherein the other metal or metals has an E° value of at least −1.00 V.

4. A method according to claim 1 wherein said physical development nuclei have a number average diameter of less than 10 nm.

5. A method according to claim 1 wherein said image receiving layer comprises a water soluble polymer in a weight ratio to the physical development nuclei from 1:1000 to 10:1.

6. A method according to claim 1 wherein said physical development nuclei consist of a substantially homogeneous solid solution of three different metals.

7. A method according to claim 1 wherein as a source for said high flux radiolysis an electron accelerator is used.

8. A method according to claim 7 wherein said electron accelerator has a power between 5 and 500 kW.

9. A method according to claim 7 wherein said electron accelerator delivers electrons with an energy between 1 and 10 MeV.

10. A method according to claim 7 wherein said electron accelerator delivers electrons with a dose rate between 0.5 and 200 kGy.s$^{-1}$.

11. A method for obtaining a lithographic printing plate according to the DTR-process by image-wise exposing an imaging element prepared according to claim 1 and developing said imaging element using an alkaline processing liquid in the presence of a developing agent and a silver halide solvent.

* * * * *